United States Patent [19]

Bethards

[11] 4,216,427

[45] Aug. 5, 1980

[54] ADAPTIVE AUDIO COMPRESSOR

[75] Inventor: Charles W. Bethards, Schaumburg, Ill.

[73] Assignee: Motorola, Inc., Schaumburg, Ill.

[21] Appl. No.: 915,485

[22] Filed: Jun. 14, 1978

Related U.S. Application Data

[62] Division of Ser. No. 670,505, Mar. 25, 1976, Pat. No. 4,110,699.

[51] Int. Cl.² .......................... H04B 1/04; H03B 3/02
[52] U.S. Cl. .................................. 455/119; 328/168; 307/237; 328/175; 307/264; 333/14
[58] Field of Search ............... 325/144, 159, 182, 187, 325/410; 330/278, 298, 284; 328/168, 171, 172, 175; 333/14; 307/237, 264, 297

[56] References Cited

U.S. PATENT DOCUMENTS

| | | | |
|---|---|---|---|
| 3,249,871 | 5/1966 | Duncan, Jr. | 325/159 |
| 3,422,356 | 1/1969 | Fritts | 325/144 |
| 3,866,146 | 2/1975 | Augustin et al. | 325/159 |
| 3,943,446 | 3/1976 | Quidort | 325/144 |
| 3,988,694 | 10/1976 | Yamazaki | 330/278 |
| 4,088,956 | 5/1978 | Axman | 325/144 |

Primary Examiner—Robert L. Griffin
Assistant Examiner—Tommy P. Chin
Attorney, Agent, or Firm—Phillip H. Melamed; James W. Gillman

[57] ABSTRACT

An amplitude modulated transmitter includes an audio amplifier which, via a radio frequency (RF) power supply modulator, modulates an RF amplifier and carrier. Fluctuations in the direct current DC bias to the RF amp, such as are common in mobile applications, vary the modulation index of the transmitted signal.

To minimize DC bias affects on the modulation index, the invention contemplates an audio compressor which senses both audio signal level and DC bias level and, in response thereto, controls audio signal compression to maintain the desired percent modulation. Compression is effected by changing the bias on a semiconductor device which, in turn, attenuates audio signals at the input of a fixed gain audio amplifier. A feedback path around the audio amplifier senses both DC voltage and audio signal level and produces an appropriate control signal to bias the semiconductor device, thereby altering audio compression.

6 Claims, 1 Drawing Figure

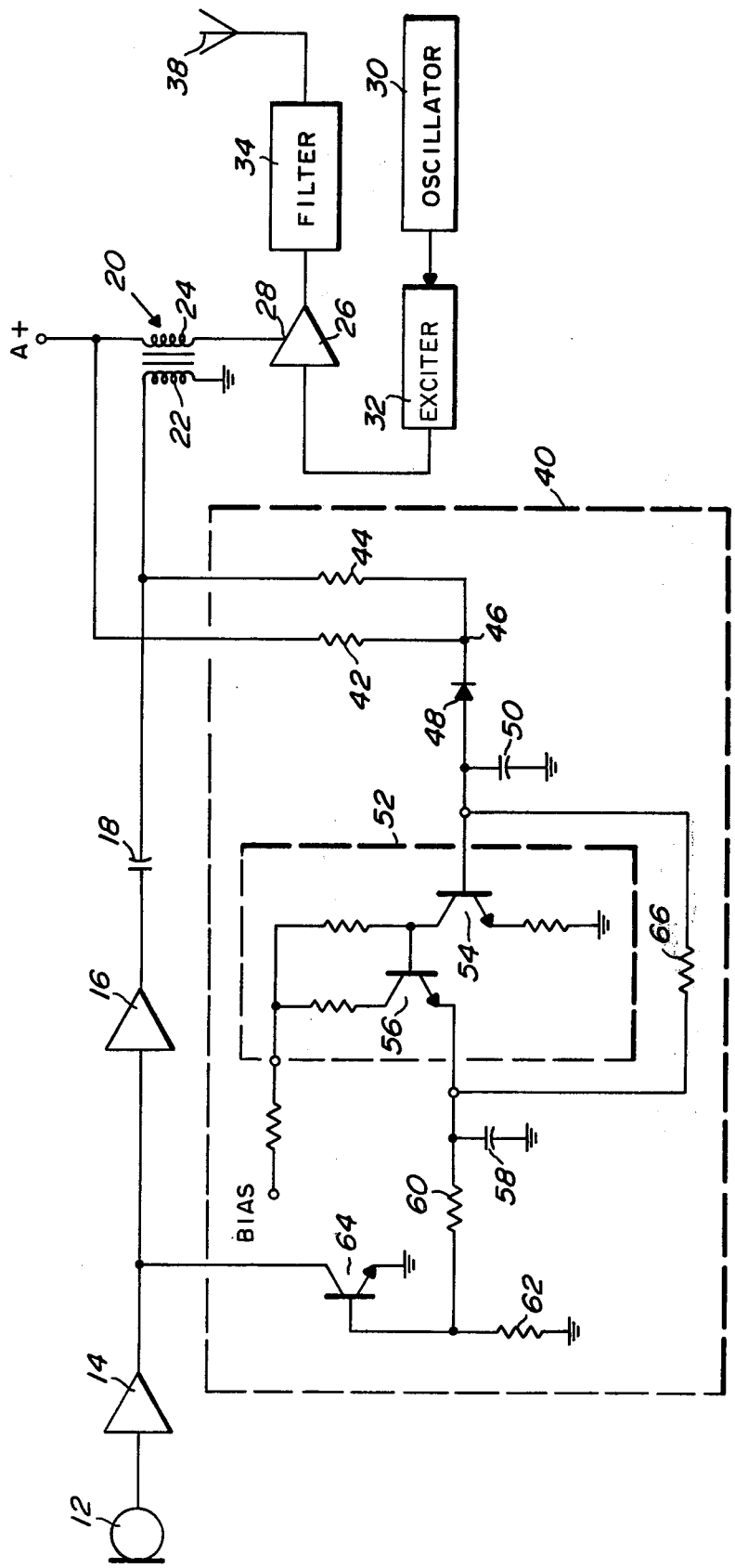

ADAPTIVE AUDIO COMPRESSOR

This is a division of application Ser. No. 670,505, filed Mar. 25, 1976, now U.S. Pat. No. 4,110,699.

BACKGROUND OF THE INVENTION

This invention relates to electronic signal compressors and, more particularly, to an audio compressor for use in an amplitude modulated transmitter.

Compression amplifiers are well known in the art. Such amplifiers are commonly used in audio signal applications wherein the dynamic range of an audio signal must be compressed to adapt the signal to a particular function. For example, audio compressors are used in the recording of music on tape and on phonograph disc. In particular, audio compressors are utilized in radio frequency signal transmitters to maintain a given index of modulation in the RF signal. Thus, amplitude modulated radio frequency transmitters are known to employ audio compressors as an attempt to maintain the percentage modulation within a given maximum.

A problem suffered with prior art amplitude modulated transmitters which employ audio compressors is that the modulation index is a function of DC bias to the radio frequency amplification stage. Generally, as the DC bias to a class C RF amplifier decreases, a given audio signal will modulate the RF amplifier to a higher modulation index. Conversely, as the DC bias voltage increases, percent modulation decreases. This problem is particularly acute in mobile operated transmitters wherein the DC bias voltage may undergo a substantial change in value.

SUMMARY OF THE INVENTION

It is an object of this invention, therefore, to provide an improved audio compressor whose compression characteristic is adaptive to a changing DC bias potential.

It is a particular object of this invention to provide an above described audio compressor for use in a mobile, amplitude modulated transmitter to provide a constant percent modulation.

Briefly, according to the invention, a signal processor which is responsive to a DC voltage includes an amplifier which accepts AC signals at its input and reproduces them with a fixed gain at its output. An attenuator is located at the input of the amplifier for controlling the level of AC signals at the amplifier input responsive to a control signal. A first circuit senses the level of the DC voltage and produces a sense signal representative thereof. A second circuit senses the level of the AC signals produced at the output of the amplifier and develops a corresponding representative signal. The signals from the first and second circuits are processed through a control signal means which develops a predetermined control signal in response thereto. This control signal is coupled to the attenuator by coupling means whereby the level of AC signals at the amplifier input, and thereby output, are controlled responsive to both the AC signal level and the DC bias potential.

BRIEF DESCRIPTION OF THE DRAWING

The attached FIGURE is a schematic diagram of an amplitude modulated transmitter which includes the adaptive compressor according to the invention.

DETAILED DESCRIPTION OF THE PREFERRED EMBODIMENT OF THE INVENTION

The FIGURE illustrates an amplitude modulated transmitter, especially suited to mobile applications, wherein audio signals to be transmitted over an RF carrier are generated via a microphone 12. The audio signals are thereafter preamplified by amplifier 14, further amplified by audio amplifier 16 and capacitively coupled through capacitor 18 to the primary winding 22 of a power supply modulating transformer 20. The modulating transformer 20 secondary winding 24 couples between a direct current (DC) supply bias A+ and a DC bias input 28 of an RF power amplifier 26.

The RF power amplifier 26 normally produces at its output terminal an RF carrier which is generated by an oscillator 30 and amplified by an exciter 32 before being passed to the input of the RF power amplifier 26. Audio signals on the primary 22 of transformer 20 modulate the bias A+ to the RF power amplifier 26 whereby the output from the RF power amplifier is an amplitude modulated RF carrier. The amplitude modulated carrier is filtered via a scrape filter 34 which is tuned to pass only those signals in the desired passband thereby rejecting out of band signals generated through nonlinearities in the system. The output of the filter drives an antenna 38.

Inherent within this amplitude modulating scheme is the fact that the value of DC bias A+ at the DC bias input 28 of RF amplifier 26 causes a variance in the modulation of the RF carrier. Thus, especially in mobile applications wherein the DC bias A+ tends to vary, the percent modulation is very DC bias dependent. This is undesireable in that there are prescribed limits for percent modulation, and that an improved signal can be recovered at the receiver if the percent modulation remains constant.

To compensate for DC bias supply variations, an improved compressor utilizing a feedback circuit 40 is employed. The input to the compressor is taken off of a voltage divider which is comprised of a pair of series connected resistors 42, 44. The free end of resistor 42 connects to the DC bias A+ whereas the free end of resistor 44 connects to the output of audio amplifier 16 and, therefore, to the primary 22 of transformer 20. The connection is made on the negative side of capacitor 18 and, therefore, since the primary 22 of transformer 20 connects to ground potential, the free end of resistor 44 is essentially connected to ground for DC analysis purposes. The common connection 46 of the resistors produce a DC voltage which is representative of the DC bias potential A+ voltage, and an AC voltage which is representative of the AC signal level at the output of amplifier 16. Thus, the voltage at connection 46 can be expressed as follows:

$$V_{46} = \frac{R_{44} \cdot A+}{R_{42} + R_{44}} + \frac{V_{ac} \cdot R_{42}}{R_{42} + R_{44}}$$

where $V_{ac}$ is the level of AC voltage at the primary 22 of transformer 20. The AC signals are rectified by a rectifier 48 and filtered by a capacitor 50. This resultant DC voltage is applied through diode 48 to the input of an amplifier 52. Amplifier 52 is comprised of a pair of NPN transistors 54, 56, whereby transistor 54 is connected in a common emitter configuration, with transistor 56 acting as a voltage follower. Both transistors include load resistors which couple to a common bias resistor which connects to a bias potential, and transistor 54 is provided with an emitter resistor coupled to ground potential. The output from the amplifier 52 is taken at the emitter of transistor 56 and is filtered by a filter capacitor 58 and applied via a voltage divider, comprised of a series resistor 60 and a shunt resistor 62, to the base terminal of an attenuator transistor 64. Attenuator transistor 64 has its collector connected to the input terminal of the amplifier 16, and its emitter connected to ground potential. Control signals at the base of transistor 64 cause the attenuator to either increase or decrease in impedance thereby increasing or decreasing, respectively, the AC input signals to amplifier 16. Thus, the level of AC signals appearing at the output of amplifier 16, and the primary of transformer 20, is dependent on the control signal appearing at the base of transistor 64, which is in turn dependent on amplifier 52 and the sense voltages appearing at the common connection 46 of the voltage divider 42, 44. A feedback resistor 66 is provided from the output of the amplifier 52 to its input providing a reference DC bias level to the base of transistor 54 which causes approximately 1.0 volt to appear at the emitter of transistor 56. Resistors 60 and 62 voltage divide the 1 volt to a level which is insufficient to turn on attenuator 64.

For voltages at the base of transistor 54 which are about its reference bias level, the amplifier produces this constant 1.0 volt level at its output. However, for applied control voltages at the base of transistor 54 which are less than the reference bias level, an increased voltage appears at the emitter of transistor 56 causing an increased conduction of transistor 64 and increased attenuation of the signals of the input at amplifier 16.

By approximating the threshold voltage at the common connection 46 at which transistor 54 will begin turning off as zero volts, the above equation can be rearranged where:

$$V_{ac} = R_{44}/R_{42} \cdot A+$$

Hence, the compressor process is directly dependent on the DC bias potential level A+. By selecting the resistor ratio of $R_{44}$ to $R_{42}$ any desired AC voltage $V_{ac}$ may be developed to correspond to a given DC supply bias potential A+.

With the adaptive feedback loop 40, as the DC bias potential A+ increases thus tending to cause a decrease of the modulation index for the same level of audio input signal, the system reacts by increasing the voltage at the base of transistor 54 thus requiring a larger AC signal at the output of amplifier 16 to begin compression. The result is an increased audio signal at the output of amplifier 16 which exactly compensates for the increase in DC bias potential A+ thereby maintaining the modulation index. Conversely, as DC bias potential A+ decreases, the voltage at the base of transistor 54 is biased closer to cutoff, whereby the control signal on transistor 64 reduces the collector impedance thereof, thereby decreasing the audio signal level at the output of amplifier 16.

It should be noted that the compressor circuit automatically varies the compression level dependent upon the power supply A+ level without changing the compression range. Further, the circuit is largely temperature insensitive since changes in the turn-on voltage of transistor 54 are compensated by a corresponding change in diode 48.

In summary, an improved audio compressor has been described which responds to changes in the DC bias level to thereby alter the compression characteristic. In the preferred embodiment of the invention, the improved compressor is shown to have superior performance in maintaining the modulation index of an amplitude modulated transmitter at a substantially constant level.

I claim:

1. In an AM transmitter wherein an audio signal modulates an RF carrier, and wherein the percent modulation of the RF carrier is a function of a DC supply voltage, the improvement comprising:
   a means for sensing the level of the DC supply voltage, and
   means for sensing the audio signal level and adjusting the audio level in response to both the sensed DC supply voltage and sensed audio signal level to maintain a substantially constant percent modulation level and the percent modulation within a given maximum limit, wherein the ratio of the audio signal level to the DC supply voltage level is maintained at a substantially constant level despite variations in the DC supply voltage level.

2. The improvement of claim 1 wherein the means for sensing the DC supply voltage further comprises means for sensing the audio signal level and, in response thereto, adjusting the audio level to maintain the percent modulation within a given maximum limit.

3. The improvement of claim 2 comprising:
   an audio amplifier, having an input and an output, for receiving an audio signal at its input, amplifying the received signal by a fixed gain factor and producing the amplified signal at the output;
   a voltage divider having a pair of series connected resistors, the free end of one resistor connected to the DC supply voltage, the free end of the remaining resistor connected to the amplifier output;
   a means for rectifying and filtering AC signals produced at the common connection of the resistors;
   a feedback amplifier having an input, an output and a predetermined activation level, the feedback amplifier output remaining in a constant state for input signals below the activation level, the feedback amplifier otherwise processing signals at its input to produce a predetermined output signal corresponding to the input signal;
   a means for coupling the common connection of the resistors and the rectified and filtered AC signals to the input of the feedback amplifier such that the amplifier remains in its constant state over a given range of DC and rectified AC signals;
   a signal controlled attenuator for controlling the magnitude of the input signals to the amplifier in response to received control signals; and
   a means for coupling the output signal from the feedback amplifier to the attenuator for controlling the attenuation thereof, such that when the feedback amplifier is in its constant state the attenuator is at minimum attenuation, the attenuator increasing in attenuation for increasing feedback amplifier input signals above the activation state.

4. The improvement of claim 3 further comprising:
   a DC biased RF amplifier for carrying the RF carrier; and a modulation transformer having a primary winding coupled between the output of the audio amplifier and a reference potential and a secondary winding coupled between the DC supply voltage and the RF amplifier for supplying DC bias thereto, whereby audio signals on the transformer primary modulate the RF carrier.

5. The improvement of claim 1 further comprising temperature compensating means for maintaining a substantially constant percent modulation level over variations in temperature which result in changes in the turn-on voltage of switching means which initiate the adjusting of the level of the audio signal.

6. The improvement of claim 3 further comprising temperature compensating means for maintaining the ratio of the amplitude of the AC signal at the amplifier output to the DC voltage level substantially constant over variations in temperature which result in changes in the turn-on voltage of the feedback amplifier.

* * * * *

UNITED STATES PATENT AND TRADEMARK OFFICE
CERTIFICATE OF CORRECTION

PATENT NO. : 4,216,427
DATED : August 5, 1980
INVENTOR(S) : Charles W. Bethards

It is certified that error appears in the above-identified patent and that said Letters Patent are hereby corrected as shown below:

Col. 6, line 9, insert --(activation level)-- after "turn-on".

Signed and Sealed this

Fourth Day of November 1980

[SEAL]

Attest:

SIDNEY A. DIAMOND

Attesting Officer

Commissioner of Patents and Trademarks